United States Patent
Wang et al.

(10) Patent No.: US 10,825,966 B2
(45) Date of Patent: Nov. 3, 2020

(54) DISPLAY PANEL, DISPLAY DEVICE AND DISPLAY METHOD

(71) Applicants: BOE TECHNOLOGY GROUP CO., LTD., Beijing (CN); BEIJING BOE DISPLAY TECHNOLOGY CO., LTD., Beijing (CN)

(72) Inventors: Zhidong Wang, Beijing (CN); Lianjie Qu, Beijing (CN); Yun Qiu, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 118 days.

(21) Appl. No.: 15/962,330

(22) Filed: Apr. 25, 2018

(65) Prior Publication Data
US 2019/0081220 A1    Mar. 14, 2019

(30) Foreign Application Priority Data
Sep. 14, 2017    (CN) .......................... 2017 1 0828272

(51) Int. Cl.
*H01L 33/50* (2010.01)
*H01L 27/15* (2006.01)
(Continued)

(52) U.S. Cl.
CPC ............ *H01L 33/507* (2013.01); *G02F 1/167* (2013.01); *G02F 1/1677* (2019.01);
(Continued)

(58) Field of Classification Search
CPC ..... H01L 33/507; H01L 27/156; H01L 33/60; H01L 33/502; G02F 1/1677; G02F 1/167;
(Continued)

(56) References Cited

U.S. PATENT DOCUMENTS

2009/0051284 A1\* 2/2009 Cok .................... H01L 27/3213
                                                  313/506
2012/0081892 A1 4/2012 Kubota
(Continued)

FOREIGN PATENT DOCUMENTS

| CN | 102548079 A | 7/2012 |
|---|---|---|
| CN | 102681282 A | 9/2012 |
| JP | 2014-022349 A | 2/2014 |

OTHER PUBLICATIONS

The First Chinese Office Action dated Oct. 25, 2018; Appln No. 201710828272.4.

*Primary Examiner* — Hoang-Quan Ho

(57) ABSTRACT

A display panel, a display device and a display method are provided. The display panel includes a base substrate, a pixel array and a light conversion layer. The pixel array is arranged on the base substrate and includes a plurality of pixel units, and the light conversion layer is arranged on a display side of the pixel array. Each of the plurality of pixel units includes an optical resonant structure, and the optical resonant structure includes a first reflection layer, a second reflection layer and a dielectric layer. The first reflection layer is arranged on the base substrate, the second reflection layer is arranged on the first reflection layer and is parallel to the first reflection layer, and the dielectric layer is arranged between the first reflection layer and the second reflection layer.

17 Claims, 4 Drawing Sheets

(51) Int. Cl.
*H01L 33/60* (2010.01)
*G02F 1/167* (2019.01)
*G02F 1/1677* (2019.01)
*G02F 1/1681* (2019.01)

(52) U.S. Cl.
CPC .......... H01L 27/156 (2013.01); H01L 33/502 (2013.01); H01L 33/60 (2013.01); *G02F 1/1681* (2019.01); *G02F 2201/34* (2013.01); *G02F 2202/36* (2013.01); *G02F 2203/055* (2013.01); *G02F 2203/64* (2013.01)

(58) Field of Classification Search
CPC ............. G02F 2201/34; G02F 2202/36; G02F 2203/055; G02F 1/1681; G02F 2203/64
See application file for complete search history.

(56) References Cited

U.S. PATENT DOCUMENTS

| | | | |
|---|---|---|---|
| 2014/0043671 A1* | 2/2014 | Kodaira | G02B 26/005 359/290 |
| 2015/0370141 A1* | 12/2015 | Guo | G02F 1/167 359/296 |

* cited by examiner

DISPLAY PANEL, DISPLAY DEVICE AND DISPLAY METHOD

TECHNICAL FIELD

At least an embodiment of the present disclosure relates to a display panel, a display device and a display method.

BACKGROUND

Reflective display technology realizes display function by reflecting environmental light. In a case where environmental light is sufficient, a reflective display device illuminates its screen by using light reflected by a reflection surface. But, some reflective display devices have a low output rate of reflection light so that it is difficult to achieve an ideal display result; and in a case where environmental light is insufficient, the display result is more undesirable, even the reflective display device is unable to work. Therefore, improving the light-outputting rate of the reflective display device is beneficial to improve the utilization efficiency of light and improve display quality.

SUMMARY

According to embodiments of the disclosure, a display panel is provided. The display panel comprises: a base substrate; a pixel array arranged on the base substrate and comprising a plurality of pixel units; and a light conversion layer arranged on a display side of the pixel array. Each of the plurality of pixel units comprises an optical resonant structure, and the optical resonant structure comprises: a first reflection layer arranged on the base substrate; a second reflection layer arranged on the first reflection layer and parallel to the first reflection layer; and a dielectric layer arranged between the first reflection layer and the second reflection layer.

For example, each of the plurality of pixel units comprises a first color sub-pixel unit displaying a first color, a second color sub-pixel unit displaying a second color and a third color sub-pixel unit display a third color, and the first color, the second color and the third color are different from each other.

For example, the light conversion layer comprises a first color light conversion layer, a second color light conversion layer and a third color light conversion layer, the first color light conversion layer is provided in a region where the first color sub-pixel unit is provided, the second color light conversion layer is provided in a region where the second color sub-pixel unit is provided, and the third color light conversion layer is provided in a region where the third color sub-pixel unit is provided.

For example, the light conversion layer is a quantum dot layer.

For example, a material of the light conversion layer is a semiconductor material.

For example, the light conversion layer is provided on the optical resonant structure.

For example, a thickness of the dielectric layer in the first color sub-pixel unit, a thickness of the dielectric layer in the second color sub-pixel unit and a thickness of the dielectric layer in the third color sub-pixel unit are different from each other.

For example, the light conversion layer is between the first reflection layer and the second reflection layer of the optical resonant structure.

For example, a sum of a thickness of the dielectric layer and a thickness of the light conversion layer in the first color sub-pixel unit, a sum of a thickness of the dielectric layer and a thickness of the light conversion layer in the second color sub-pixel unit, and a sum of a thickness of the dielectric layer and a thickness of the light conversion layer in the third color sub-pixel unit are different from each other.

For example, the first reflection layer is a total reflection layer, and the second reflection layer is a transflective layer.

For example, the display panel further comprises a microcapsule switch array arranged on the display side of the pixel array. The microcapsule switch array comprises a plurality of microcapsule switch units which are stacked on the plurality of pixel units in a one-to-one manner.

For example, each of the plurality of microcapsule switch units comprises: a microcapsule comprising a capsule wall, the capsule wall comprising an upper surface, a lower surface, a first side surface and a second side surface, and the upper surface and the lower surface being transparent; an upper electrode arranged on the upper surface of the microcapsule; and a first side electrode and a second side electrode respectively arranged on the first side surface and the second side surface of the microcapsule.

For example, the microcapsule further comprises: a liquid medium; and a plurality of black charged particles arranged in the liquid medium inside the microcapsule.

For example, the display panel further comprises: an anti-reflection layer arranged on the display side of the pixel array and above the optical resonant structure and the light conversion layer.

For example, the display panel further comprises a protection layer covering the light conversion layer and the optical resonant structure.

According to the embodiments of the disclosure, a display device is provided. The display device comprises the display panel as described above.

According to the embodiments of the disclosure, a display method applicable to the above display device is provided. The display device further comprises a microcapsule switch array arranged on the display side of the pixel array, and the microcapsule switch array comprises a plurality of microcapsule switch units which are stacked on the plurality of pixel units in a one-to-one manner; and the display method comprises: applying a signal to each of the plurality of microcapsule switch units of the microcapsule switch array to control each of the plurality of microcapsule switch units to be in an open state or an close state so as to control a grayscale of the plurality of pixel units respectively corresponding to the plurality of microcapsule switch units.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

REFERENCE NUMBERS OF DRAWINGS

Figure 1A:
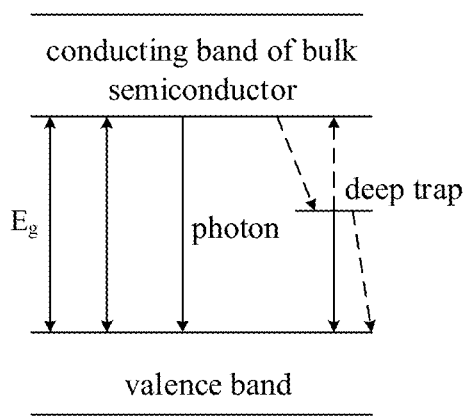
FIG. 1A is a schematic view of photoluminescence of a bulk semiconductor material.

1—base substrate; 101—first color sub-pixel unit; 102—second color sub-pixel unit; 103—third color sub-pixel unit; 2—first reflection layer; 3—dielectric layer; 301—first dielectric layer; 302—second dielectric layer; 303—third dielectric layer; 4—second reflection layer; 5—microcapsule; 6—first side electrode; 7—second side electrode; 8—light conversion layer; 9—black charged particles; 10—capsule wall; 14—pixel unit; 15—microcapsule switch unit; 16—optical resonant structure; 18—anti-reflection layer; 17—protection layer; 19—driving unit; 20—upper electrode; 100—display panel; 110—display device; 101'—first reflection plate; 102'—second reflection plate.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. "in," "out," "on," "under" and the like are only used to indicate relative position relationship, and when the position of the object which is described is changed, the relative position relationship may be changed accordingly.

The sizes of the appended drawings used in the present disclosure are not strictly according to the actual proportions. The number of black charged particles is not limited to that shown in the drawings. The specific size and number of each structure can be determined according to actual requirements, and the drawings described in the present disclosure are only schematic views of the structures.

Quantum dot is an important low dimensional semiconductor material and the sizes on three dimensions of the quantum dot are not more than two times of the Bohr radius of the exciton of the corresponding semiconductor material of the quantum dot. Quantum dots are usually spherical or near-spherical, and radial dimensions of quantum dots are usually at nanoscale. Quantum dots have unique photoelectric characteristics. Quantum dots have a distinctive characteristic: when stimulated by electricity or light, quantum dots produce pure light, and the color of the light emitted by the quantum dots is determined by the material, the size and the shape of the quantum dots. For example, the material of the quantum dots is at least one of zinc oxide, gallium nitride, zinc sulfide, cadmium sulfide, zinc selenide, gallium selenide, cadmium selenide, telluride zinc, cadmium telluride, gallium arsenide, indium phosphide, lead telluride. Of course, the material of the quantum dots includes the above-listed materials but are not limited to the above-listed materials, and other materials with the same characteristics as or similar characteristics to the above-mentioned materials can also be applied. Taking zinc sulfide (ZnS) quantum dots as an example, the size of the quantum dots which emit red light is about 9~10 nm, the size of the quantum dots which emit yellow light is about 8 nm, and the size of the quantum dots which emit green light is about 7 nm.

Figure 1B:
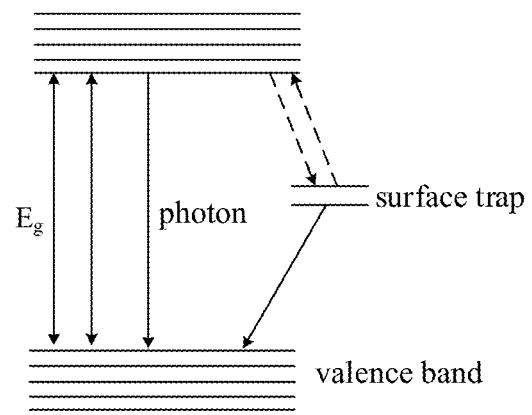
FIG. 1B is a schematic view of photoluminescence of a semiconductor quantum dot.

The following is a brief introduction of the luminescence principle of semiconductor quantum dots. FIG. 1A is a schematic view of photoluminescence of a bulk semiconductor material, and FIG. 1B is a schematic view of photoluminescence of a semiconductor quantum dot. As shown in FIG. 1A and FIG. 1B, when a beam of light is incident to the semiconductor material, after the semiconductor material absorbs photons, the electrons in the valence band transit to the conducting band, and the electrons in the conducting band may transit back to the valence band and at the same time the photons are emitted, and thus photoluminescence occurs. The electrons in the conducting band may also fall into the electron trap of the semiconductor material. In a case where the electrons fall into a deeper electron trap, most of the electrons are quenched in the form of non-radiation and only a small number of the electrons transit back to the valence band in the form of photons or transit back to the conducting band after absorbing a certain energy. Therefore, as illustrated in FIG. 1A, in a case where the electron trap of the semiconductor material is deeper, the luminescent efficiency of the semiconductor material is significantly reduced; however, as illustrated in FIG. 1B, in a case where the semiconductor material has many surface traps, the luminescent efficiency of the semiconductor material is significantly increased.

Fabry-Perot interferometer is also known as Fabry-Perot resonant cavity which produces good multiple-beam interference result by using light reflection. The following is a brief introduction of the structure and the principle of Fabry-Perot resonant cavity.

Figure 2:
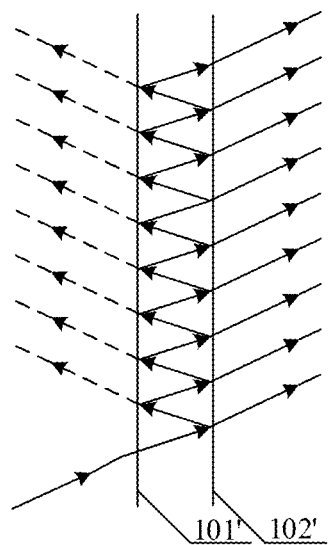
FIG. 2 is a schematic view of the working principle of the Fabry-Perot resonant cavity.

FIG. 2 is a schematic view of the working principle of the Fabry-Perot resonant cavity. As illustrated in FIG. 2, Fabry-Perot resonant cavity, for example, is a multiple-beam interferometer comprising two parallel reflection plates 101' and 102', and an internal surface of the first reflection plate 101' facing the second reflection plate 102' and an internal surface of the second reflection plate 102' facing the first reflection plate 101' have a high reflectivity. After a beam of light enters the space between the first reflection plate 101' and the second reflection plate 102', multiple reflections and incidences of the light occur between the first reflection plate 101' and the second reflection plate 102' (in this case, the first reflection plate 101' and the second reflection plate 102' serve as cavity mirrors of the resonant cavity), and the incident wave and reflection wave interfere with each other. In order to create a stable oscillation of the self-reproducing mode in the resonant cavity, the light wave is required to be strengthened by the interference, that is, the condition of satisfying the resonance is that the total phase shift of the light wave in the cavity is equal to the integer times of $2\pi$, that is, $$2\Delta\Phi = 2q\pi, \quad q = 1, 2, 3, \quad (1)$$

In the formula (1), $2\Delta\Phi$ is the total phase shift of the light wave, and q is a dimensionless positive integer called as the longitudinal mode coefficient. It can be obtained according to the formula (1) that only light satisfying the formula (2) can have a maximum transmissivity in the Fabry-Perot resonant cavity.

$$v_q = q \frac{c}{2nL\cos i_2} \quad (2)$$

In the formula (2), L is the distance between the first reflection plate 101' and the second reflection plate 102', c is light speed, and n is the refractive index of a medium between the first reflection plate 101' and the second reflection plate 102'. In a case where the medium between the first reflection plate 101' and the second reflection plate 102' is air, it can be considered approximately that n equals 1. In a case where the medium between the first reflection plate 101' and the second reflection plate 102' is determined and the incident angle $i_1$ of the incident light is determined (that is, the transmission angle $i_2$ is determined), it can be obtained that the frequency $v_q$ of the light wave transmitted out of the resonant cavity is relevant to the length L of the resonant cavity, and adjusting the distance between the first reflection plate 101' and the second reflection plate 102' enables the light waves with a certain frequency or wavelength to be transmitted out of the resonant cavity. Therefore, the Fabry-Perot resonant cavity has a selective effect on the outputting of the incident beam.

The structures, methods and technical effects involved in the present disclosure are explained in detail by several specific embodiments in the following.

Figure 3:
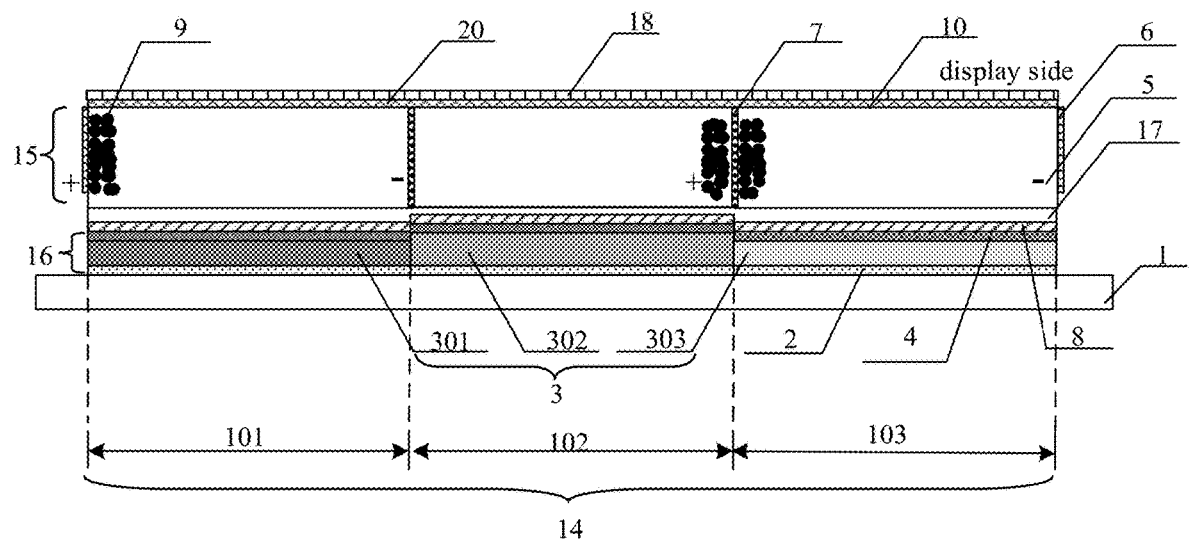
FIG. 3 is a schematic sectional view of a display unit of a display panel provided by embodiments of the present disclosure in a case that a microcapsule switch unit is open.
Figure 4:
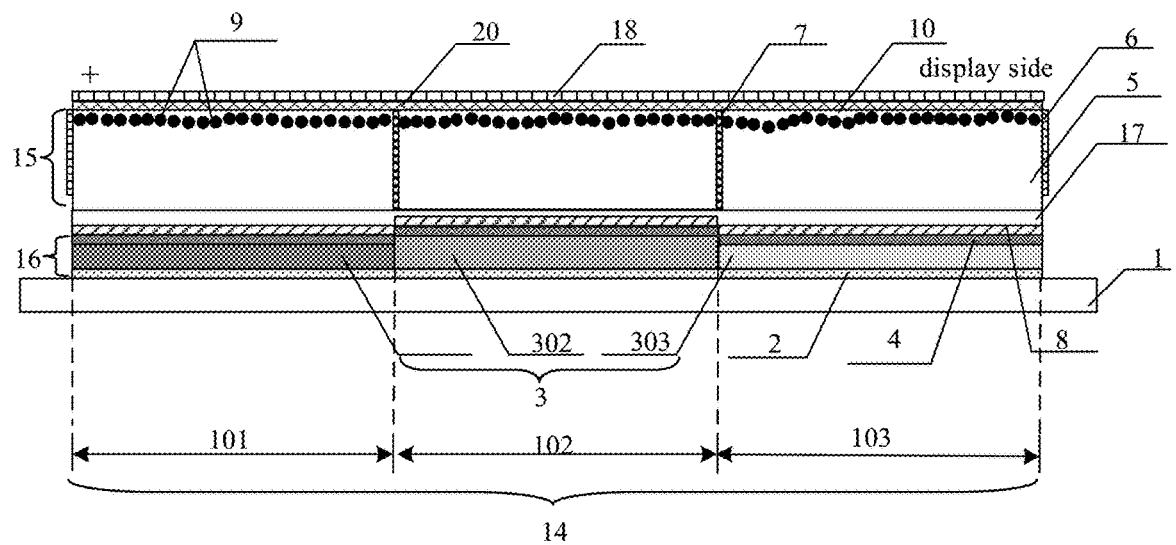
FIG. 4 is a schematic sectional view of the display unit of the display panel provided by the embodiments of the present disclosure in a case that the microcapsule switch unit is off.
Figure 5:
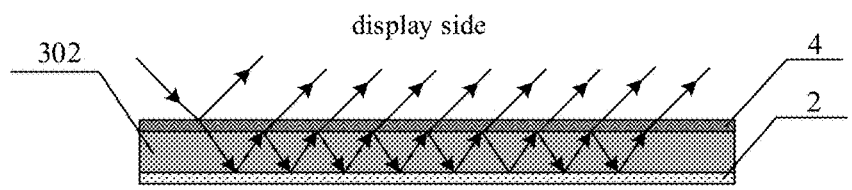
FIG. 5 is a schematic view of a light interference principle of an optical resonant structure illustrated in FIG. 3.
Figure 6:
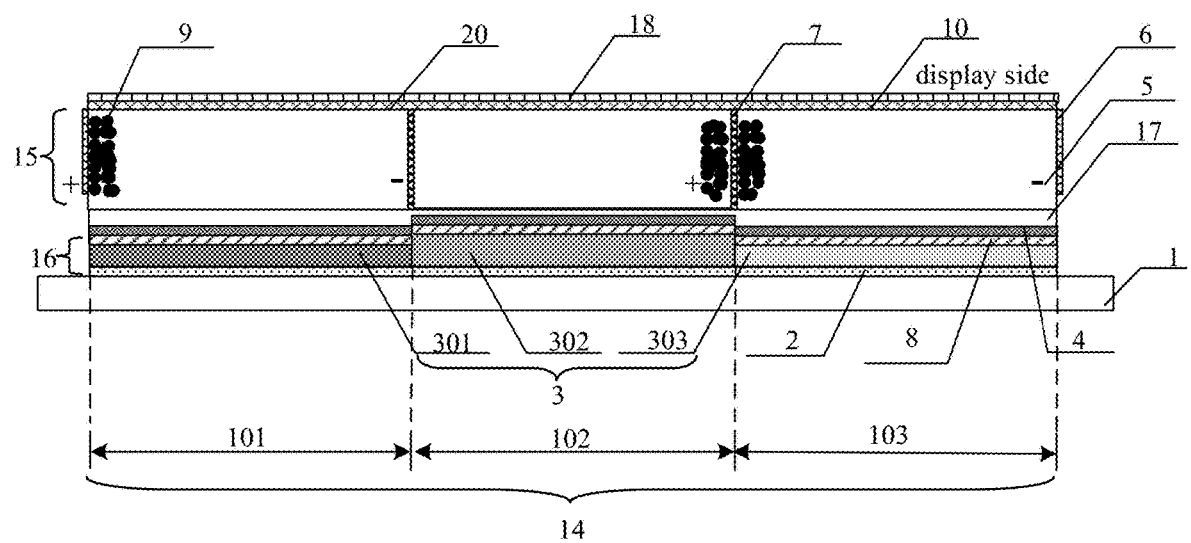
FIG. 6 is another schematic sectional view of the display unit of the display panel provided by the embodiments of the present disclosure in the case that the microcapsule switch unit is open.
Figure 7:
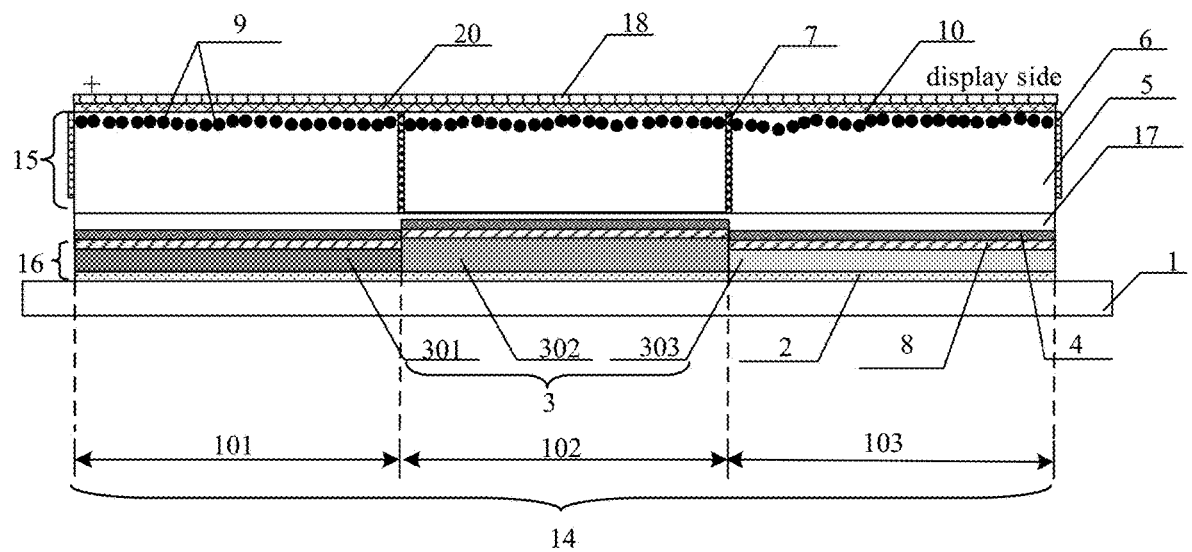
FIG. 7 is another schematic sectional view of the display unit of the display panel provided by the embodiments of the present disclosure in the case that the microcapsule switch unit is close.

FIG. 3 is a schematic sectional view of a display unit of a display panel provided by the embodiments of the present disclosure in the case that a microcapsule switch unit is open, FIG. 4 is a schematic sectional view of the display unit of the display panel provided by the embodiments of the present disclosure in the case that the microcapsule switch unit is close, FIG. 5 is a schematic view of a light interference principle of an optical resonant structure illustrated in FIG. 3, FIG. 6 is another schematic sectional view of the display unit of the display panel provided by the embodiments of the present disclosure in the case that the microcapsule switch unit is open, and FIG. 7 is another schematic sectional view of the display unit of the display panel provided by the embodiments of the present disclosure in the case that the microcapsule switch unit is close.

The embodiments of the present disclosure provide a display panel, and the display panel comprises a base substrate, a pixel array and a light conversion layer. The pixel array is arranged on the base substrate and comprises a plurality of pixel units, and the light conversion layer is arranged on a display side of the pixel array. Each of the pixel units comprises an optical resonant structure, and the optical resonant structure comprises a first reflection layer arranged on the base substrate, a second reflection layer arranged on the first reflection layer and parallel to the first reflection layer, and a dielectric layer arranged between the first reflection layer and the second reflection layer.

For example, as illustrated in FIG. 3 and FIG. 4, a display panel 100 comprises a base substrate 1, a pixel array and a light conversion layer 8. The pixel array is arranged on the base substrate 1, and the pixel array comprises a plurality of pixel units 14. Each of the pixel units 14 comprises an optical resonant structure 16, and the optical resonant structure 16 comprises a first reflection layer 2, a second reflection layer 4 and a dielectric layer 3. The first reflection layer 2 is arranged on the base substrate 1, and the second reflection layer 4 is arranged on the first reflection layer 2 and parallel to the first reflection layer 2, and the dielectric layer 3 is arranged between the first reflection layer 2 and the second reflection layer 4. The dielectric layer 3 is transparent. A material of the dielectric layer 3, for example, is aluminum oxide, silicon oxide, silicon nitride, organic resin and the like. The optical resonant structure 16 is a Fabry-Perot resonant cavity, capable of producing multiple-beam interference and has a selective effect on the outputting of the incident light beam. For example, the environmental light enters the optical resonant structure 16, light with a particular wavelength (i.e. light of a particular color) is strengthened by interference and is transmitted to the display side of the pixel array from the optical resonant structure 16 after multiple reflections, and thus a display function of the pixel unit is realized. The light conversion layer 8 is arranged on the display side of the pixel array and a portion of the environmental light is converted into the light with the particular wavelength (i.e. the light of the particular color) by the light conversion layer, and thus the final output of the light with the particular wavelength in each pixel unit is increased. In this way, the utilization of light can be improved, and thus the display quality can be improved. At the same time, the display panel can increase the color gamut and achieve a better color display result.

For example, each of the pixel units comprises a first color sub-pixel unit 101 displaying a first color, a second color sub-pixel unit 102 displaying a second color and a third color sub-pixel unit 103 displaying a third color, and the first color, the second color and the third color are different from each other. For example, in each pixel unit, each of the sub-pixel units has the dielectric layer 3 and the thicknesses of the dielectric layers in respective sub-pixel units are different from each other so that light of different colors are transmitted out of the optical resonant structure 16, and thus each of the sub-pixel units is able to select the colored light to be outputted. For example, as illustrated in FIG. 3 and FIG. 4, the dielectric layer 3 comprises three parts which correspond to the above-described three sub-pixel units one by one, and the three parts of the dielectric layer 3 respectively are a first dielectric layer 301 in the first color sub-pixel unit 101, a second dielectric layer 302 in the second color sub-pixel unit 102, and a third dielectric layer 303 in the third color sub-pixel unit 103, and the thickness of the first dielectric layer 301, the thickness of the second dielectric layer 302 and the thickness of the third dielectric layer 303 are different from each other.

In the embodiments of the present disclosure, for example, the first reflection layer 2 is a total reflection layer to reflect light, and the second reflection layer 4 is a transflective layer which reflects one portion of light and transmits the other portion of light. Accordingly, the display panel is a reflective panel. FIG. 5 is a schematic view of the light interference principle of the optical resonant structure illustrated in FIG. 3; and, referring to FIG. 3 and FIG. 5, the display principle of the display panel is described taking the second color sub-pixel unit 102 as an example. The light source of the display panel provided by the embodiments of the present disclosure for example is the environmental light; in the case that a microcapsule switch unit 15 is in an open state, the environmental light first passes through the microcapsule switch unit 15 provided on the display side of the second color sub-pixel unit 102, then the environmental light is incident to the second reflection layer 4 of the optical resonant structure 16 and enters the second dielectric layer 302 after transmitting through the second reflection layer 4, that is, the environmental light enters the optical resonant structure 16. Multiple reflections of the light occur between the first reflection layer 2 and the second reflection layer 4, and the reflected lights between the first reflection layer 2 and the second reflection layer 4 interfere with each other. Light wave whose total phase shift in the cavity for a circle of leaving the second reflection layer 4 and returning the second reflection layer 4 is equal to an integer times of $2\pi$ is strengthened, and light wave whose frequency satisfies the above formula (2) is transmitted out of the optical resonant structure 16 through the second reflection layer 4. By selecting an appropriate thickness of the second dielectric layer 302, the light with the particular frequency that transmits out of the light resonant structure 16 is selected, and the light with other frequencies is absorbed by the first reflection layer 2 and the second reflection layer 4. Therefore, a selection of the colored light which transmits out of the second color sub-pixel unit where the second dielectric layer 302 is located is realized, and thus the display color of the second color sub-pixel unit 102 is controlled. The principle of the light selection of the first color sub-pixel unit 101 and the principle of the light selection of the third color sub-pixel unit 103 are the same as that of the second color sub-pixel unit 102 mentioned above, which are not repeated here for simplicity. Therefore, in the embodiments of the present disclosure, by controlling that the first dielectric layer 301, the second dielectric layer 302 and the third dielectric layer 303 have different thicknesses, it is realized that the first color sub-pixel unit, the second color sub-pixel unit and the third color sub-pixel unit respectively display different colors. That is, in each pixel unit, the thickness of the dielectric layer in the first color sub-pixel unit, the thickness of the dielectric layer in the second color sub-pixel unit and the thickness of the dielectric layer in the third color sub-pixel unit are different from each other so that light of different colors is transmitted out of the optical resonant structure 16.

It should be noted that, as for the display panel provided by the embodiments of the present disclosure, the light source of the display panel is the environmental light, and thus the environmental light is incident on the display panel in all directions and the incidence angle is not a single value. According to the formula (2), in a case where the dielectric layer has the appropriate thickness, the frequencies of the light that is transmitted out of the optical resonant structure 16 are in a range around the above-described particular frequency. For example, as illustrated in FIG. 3 and FIG. 4, the material of the dielectric layer is the above-mentioned aluminum oxide which has a known refractivity index. For example, the thickness of the first dielectric layer 301, the thickness of the second dielectric layer 302 and the thickness of the third dielectric layer 303 are selected so that the frequencies of the light which is respectively transmitted out through the second reflection layer 4 in the first color sub-pixel unit 101, the second reflection layer 4 in the second color sub-pixel unit 102 and the second reflection layer 4 in the third color sub-pixel unit 103 are respectively in the frequency range of red light, the frequency range of green light, and the frequency range of blue light, and thus red, green and blue are respectively displayed by the first color sub-pixel unit 101, the second color sub-pixel unit 102 and the third color sub-pixel unit 103; the plurality of pixel units each comprising the first color sub-pixel unit 101, the second color sub-pixel unit 102 and the third color sub-pixel unit 103 form the pixel array of the display panel, and thus the display panel displays red, green and blue colors to realize a color display. Of course, the thickness of the first dielectric layer 301, the thickness of the second dielectric layer 302 and the thickness of the third dielectric layer 303 can be selected to be other appropriate values, so that the sub-pixel units respectively display colors other than red, green and blue. Because the optical resonant structure 16 has a selective effect on light, the light emitted from the red sub-pixel unit, the light emitted from the green sub-pixel unit and the light emitted from the blue sub-pixel unit have high purity, and thus the colored light combined by these light has a broader color gamut and more abundant colors, which brings a better display quality.

For example, a material of the first reflection layer and the second reflection layer is a metal material. For example, the first reflection layer 2 is made of a metal material which has a high reflectivity and has less absorption of light, such as Ag, Pt, Al, and the like. The first reflection layer 2 for example is a multilayer dielectric film which has less absorption of light than a metal film. For example, the first reflection layer 2 is a silver film made of Ag, the thickness of the first reflection layer 2, for example, is not less than 150 nm, and the first reflection layer 2 is a total reflection layer; the second reflection layer 4 is a Au film made of Au, the thickness of the second reflection layer 4, for example, is about 20 nm, and the second reflection layer 4 is a transflective layer. In this way, the light which is incident to the second reflection layer 4 after passing through the microcapsule switch unit 15 is permitted to enter the optical resonant structure 16, then the light is reflected between the first reflection layer 2 and the second reflection layer 4 many times, and the light is prevented from being transmitted out through the first reflection layer 2 but is transmitted out through the second reflection layer 4 to realize reflective display. It should be noted that materials of the first reflection layer and the second first reflection layer are not limited to the above species in the embodiments of the present disclosure.

For example, the light conversion layer 8 comprises a first color light conversion layer, a second color light conversion layer and a third color light conversion layer; the first color light conversion layer is provided in a region where the first color sub-pixel unit 101 is provided, the second color light conversion layer is provided in a region where the second color sub-pixel unit 102 is provided, and the third color light conversion layer is provided in a region where the third color sub-pixel unit 103 is provided. The corresponding light conversion layer in each sub-pixel unit is designed according to the colored light to be transmitted out of each sub-pixel unit. For example, in a case where the first color sub-pixel unit 101, the second color sub-pixel unit 102 and the third color sub-pixel unit 103 respectively display red, green and blue, the first color light conversion layer, the second color light conversion layer and the third color light conversion layer respectively convert at least a portion of other colored light into the corresponding red light, green light, or blue light, and thus the light utilization can be increased, which is beneficial to improving the display quality of the display panel 100. And in this way, on the basis that the optical resonant structure enhances the color purity of the colored light transmitted out of each sub-pixel unit, the color purity of the colored light can be further increased, which is beneficial to obtaining a broader color gamut.

For example, the light conversion layer 8 is a quantum dot light conversion layer. For example, in a case where the first color sub-pixel unit 101, the second color sub-pixel unit 102 and the third color sub-pixel unit 103 respectively display red, green and blue, the first color light conversion layer, the second color light conversion layer and the third color light conversion layer respectively are a red quantum dot light conversion layer, a green quantum dot light conversion layer and a blue quantum dot light conversion layer. Of course, the quantum dot light conversion layer in embodiments of the present disclosure is not limited to the three quantum dot layers of red, green and blue. For example, as illustrated in FIG. 3 and FIG. 4, the light conversion layer 8 is provided on the optical resonant structure 16. For example, as for the first color sub-pixel unit 101, the environmental light (for example, a white light) is incident to the above-mentioned red quantum dot light conversion layer, and the red quantum dot light conversion layer converts the blue light in the incident light into red light under the excitation of the blue light, and the red light in the incident light and the red light converted from the blue light by the red quantum dot light conversion layer enter the optical resonant structure 16, and other colored light also enters the optical resonant structure 16 after passing through the red quantum dot light conversion layer. Finally, the red light is reflected out of the optical resonant structure 16, so that the first color sub-pixel display red. In this way, the intensity of the red light is increased by the red quantum dot light conversion layer, and thus the light utilization is improved, and it is beneficial to obtaining a red light of higher purity and obtaining a broader color gamut. Similarly, as for the second color sub-pixel unit 102, the green quantum dot light conversion layer converts the blue light in the incident light into green light under the excitation of the blue light, and the green light in the incident light and the green light converted from the blue light by the green quantum dot light conversion layer enter the optical resonant structure 16, and other colored light also enter the optical resonant structure 16 after passing through the green quantum dot light conversion layer. Finally, the green light is reflected out of the optical resonant structure 16, so that the second color sub-pixel display green. At the same time, the intensity and the color purity of the green light are increased by the green quantum dot light conversion layer. As for the third color sub-pixel unit 103, the color purity of the blue light of the incident light is improved after passing through the blue quantum dot light conversion layer, which is beneficial to broadening the color gamut. It should be noted that in a case where the third color sub-pixel unit 103 displays blue, it is feasible that no quantum dot layer is provided in the region where the third color sub-pixel unit 103 is provided. It can be seen that the quantum dot layer can improve the light intensity of each sub-pixel unit to improve the light utilization, and meanwhile, the quantum dot layer enables the colored light of each sub-pixel unit to have a higher color purity to obtain a broader color gamut, which is beneficial to obtaining a higher display quality.

For example, a material of the light conversion layer is a semiconductor material. For example, in a case where the light conversion layer is the quantum dot layer, the quantum dot layer is formed of the elements of II-VI or III-V in the element periodic table and has a quantum size effect, that is, by controlling the shape, structure and size of quantum dots, the electronic state such as the band gap, the exciton binding energy, the energy blue shift of the exciton and the like of the quantum dots are adjusted. In the embodiments of the present disclosure, for example, the quantum dots are silicon quantum dots, germanium quantum dots, CdS quantum dots, CdSe quantum dots, CdTe quantum dots, ZnSe quantum dots, PbS quantum dots, PbSe quantum dots, InP quantum dots, InAs quantum dots and the like. Of course, materials of the quantum dots in embodiments of the present disclosure are not limited to the above-listed species.

The smaller the size of the quantum dots is, the shorter the wavelength of the stimulated luminescence is; and the larger the size of the quantum dots is, the longer the wavelength of the stimulated luminescence is. Therefore, light of different colors are emitted by changing the size of the quantum dots. For example, as for the red quantum dot light conversion layer, the green quantum dot light conversion layer and the blue quantum dot light conversion layer respectively corresponding to the first color sub-pixel unit 101, the second color sub-pixel unit 102 and the third color sub-pixel unit 103, the stimulated luminescence is red light, green light and blue light respectively. Those skilled in the art can design the size of the quantum dots according to requirements to obtain the required stimulated luminescence.

For example, the display panel 100 further comprises a microcapsule switch array arranged on the display side of the pixel array, and the microcapsule switch array comprises a plurality of microcapsule switch units 15 which are stacked on the plurality of pixel units in a one-to-one manner. For example, one microcapsule switch unit 15 is arranged on the display side of each sub-pixel unit, and each microcapsule switch unit 15 overlaps its corresponding sub-pixel unit to control the switch between a display state and a non-display state of the sub-pixel unit and control the grayscale of the sub-pixel unit.

As illustrated in FIG. 3 and FIG. 4, each of the microcapsule switch units 15 comprises a microcapsule 5, an upper electrode 20, a first side electrode 6 and a second side electrode 7. The microcapsule 5 comprises a capsule wall 10 which encircles an internal capsule cavity, and the microcapsule 5 comprises an upper surface, a lower surface, a first side surface and a second side surface; the upper surface and the lower surface are transparent, in the case that the microcapsule switch unit 15 is in the open state, the incident light reaches the second reflection layer 4 after passing through the microcapsule switch unit 15 and thus enter the optical resonant structure 16. The first side electrode 6 and the second side electrode 7 are respectively arranged on the first side surface of the microcapsule 5 and the second side surface of the microcapsule 5. In the embodiments of the present disclosure, among three microcapsule switch units 15 corresponding to the three sub-pixel units, two adjacent microcapsule switch units 15 contact with each other and share a same side electrode. For example, the second side electrode 7 of the microcapsule provided on the third color sub-pixel unit 103 is also used as the first side electrode 6 of the microcapsule provided on the second color sub-pixel unit 102, that is, it used as a common electrode, which can further simplify the structure of the display panel, simplify the production process and save the process cost and the material cost. For example, the second side electrode 7 of the microcapsule provided on the third color sub-pixel unit 103 is not used as the first side electrode 6 of the microcapsule provided on the second color sub-pixel unit 102, that is, two adjacent microcapsule switch units 15 contacting with each do not share a same electrode.

As illustrated in FIG. 3 and FIG. 4, each of the microcapsule switch units 15 comprises a liquid medium provided inside the microcapsule 5 and a plurality of black charged particles 9 arranged in the liquid medium, and the plurality of black charged particles 9 are capable of moving in the liquid medium driven by an electric field to realize a switch between a display state and a non-display state.

The above-mentioned capsule wall 10 for example is made of natural polymer materials, such as gelatin, rosin, Arabia gum and the like; or the capsule wall 10 for example is made of synthetic polymer materials such as carboxymethyl cellulose, methyl cellulose, polyethylene, polystyrene, polyurethane and the like. The method of preparing the capsule wall 10 comprises but is not limited to chemical methods, physicochemical methods or physical mechanical methods. For example, the chemical methods include interfacial polymerization method and the like. The liquid medium for example is electrophoretic liquid which includes dispersant, charge control agent and the like. The dispersant for example is Epoxy compounds, aromatic hydrocarbons, halogenated hydrocarbons, aliphatic hydrocarbons, siloxane and the like, and a specific example of the dispersant is tetrafluoroethylene; the charge control agent for example is organic sulfates, metal soaps, organic amides, organophosphates, phosphate esters and the like. According to the requirements, dyes and stabilizing agents may be further added to the electrophoretic solution, and the stabilizing agents, for example, are sodium dodecyl benzene sulfonate which is an anionic surface active agent. For example, the black charged particles are particles made of Fe oxides, such as particles made of $Fe_3O_4$, but the black charged particles in the embodiments of the present disclosure are not limited to the above-listed species.

For example, the plurality of black charged particles 9 are negatively charged. As illustrated in FIG. 3, an electric signal is applied to the first side electrode 6 and the second side electrode 7 so that the first side electrode 6 serves as a positive pole and the second side electrode 7 serves as a negative pole, and no electric signal is applied to the upper electrode 20. Driven by the electric field, the black charged particles 9 gather near the first side electrode 6. At this time, the microcapsule switch unit 15 is in the open state, and the environmental light passes through the microcapsule switch unit 15 and then enters the optical resonant structure 16; the light interference occurs, and the light of the particular frequency which satisfies the above-mentioned condition is transmitted out of the optical resonant structure 16 and then passes through the microcapsule switch unit corresponding to the sub-pixel unit, so that the sub-pixel unit displays the color corresponding to the light of the particular frequency. For example, the grayscale of the sub-pixel unit corresponding to the microcapsule switch unit 15 is controlled by controlling the amount of the electric signal applied to the upper electrode 20 of the microcapsule switch unit 15. As illustrated in FIG. 4, an electric signal is applied to the upper electrode 20 so that the upper electrode 20 serves as a positive pole, and no electric signal is applied to the first side electrode 6 and the second side electrode 7; in this case, the black charged particles 9 gather near the upper electrode 20, which prevents the environmental light from passing through microcapsule 5. At this time, the microcapsule switch unit 15 is in the close state, and then environmental light is blocked by the black charged particles 9 and cannot pass through the microcapsule switch unit 15 and thus cannot enter the optical resonant structure 16, and the pixel unit is in a black state. For example, three microcapsule switch units provided on three sub-pixel units use a common upper electrode, and the common upper electrode controls the display state of the three sub-pixel units at the same time. For example, each of the three sub-pixel units has a separate upper electrode, and the three separate upper electrodes control the display states of the three sub-pixel units respectively.

The size of the microcapsule switch unit used in the embodiments of the present disclosure is at micron level, and the thickness of the optical resonant structure of the pixel unit is at nanoscale, and the base substrate is an ultra-thin glass substrate. Compared with the general liquid crystal display (LCD) panel, the thickness of the display panel in the embodiments of the present disclosure is quite small, and the weight of the display panel in the embodiments of the present disclosure is lighter, which makes the display panel more portable. The light source of the display panel in the embodiments of the present disclosure is the environmental light, and thus no backlight is needed, which can reduce the energy consumption. Furthermore, the display depends on the environmental light and depends on the reflection of the environmental light, and thus the display brightness can match the environmental light better to protect the user's eyesight.

For example, the display panel 100 further comprises an anti-reflection layer 18 arranged on the display side of the pixel array and above the optical resonant structure 16 and the light conversion layer 8. For example, as illustrated in FIG. 3 and FIG. 4, the anti-reflection layer 18 is provided on the microcapsule switch unit 15. When the environmental light is incident to the anti-reflection layer 18, reflection of the light is reduced and transmission of the light is increased, and thus the uncomfortable feeling of human eyes caused by the reflection light is avoided.

For example, the display panel 100 further comprises a protection layer 17 covering the light conversion layer 8 and the optical resonant structure 16. The protection layer 17 is made of organic materials, such as epoxy resin, acrylic resin and the like. The main function of the protection layer 17 is protecting the light conversion layer 8 and the optical resonant structure 16 and preventing the light conversion layer 8 from pollution, which is beneficial to improving the service life of the display panel. The protection layer 17 further flattens the surface of the optical resonant structure 16 and the light conversion layer 8, which is beneficial to the arrangement of the microcapsule switch unit 15 on the protection layer 17.

As illustrated in FIG. 6 and FIG. 7, in the embodiments of the present disclosure, the light conversion layer 8 for example is provided between the first reflection layer and the second reflection layer of the optical resonant structure. For example, the display panel 100 is in the bright state illustrated in FIG. 6, the environmental light enters the optical resonant structure 16 through the second reflection layer 4 and is reflected many times in the optical resonant structure 16, and when the light passes through the light conversion layer 8, the above-mentioned light conversion is realized by the light conversion layer 8. And in this case, the light is reflected many times in the optical resonant structure 16 and passes through the light conversion layer 8 many times, and thus a portion of blue light which is not converted into the corresponding colored light (for example, red light or green light) is converted many times, which can improve the conversion rate of light and further increase the amount of the corresponding colored light and the light utilization. It should be noted that, in this structure, the thickness of the dielectric layer 3 of the optical resonant structure 16 includes the thickness of the light conversion layer 8. Other components in the display panel illustrated in FIG. 6 and FIG. 7 are all the same as that illustrated in FIG. 3 and FIG. 4, and they can be referred to the above-mentioned description.

The embodiments according to the present disclosure further provide a display device comprising the above-mentioned display panel.

Figure 8:
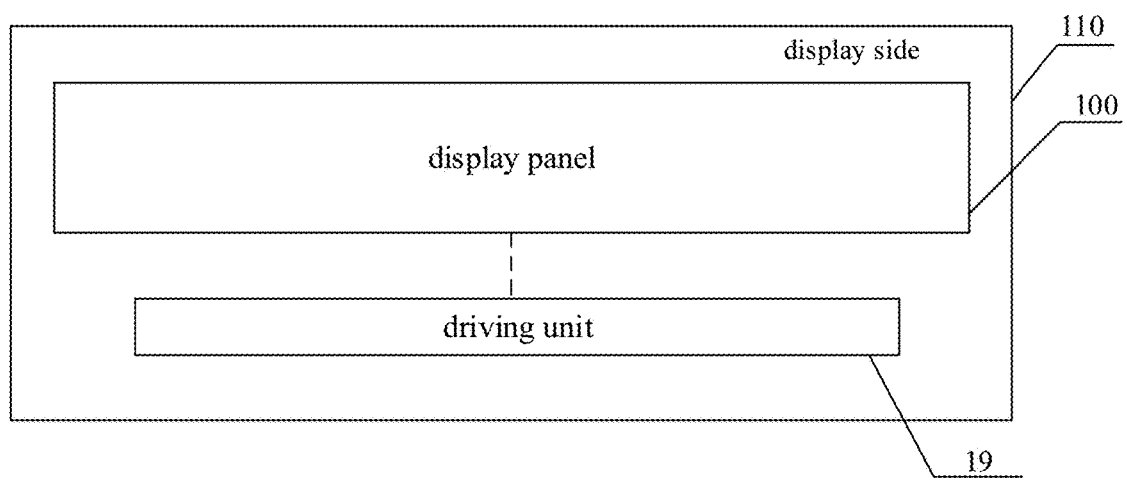
FIG. 8 is a schematic view of a display device provided by embodiments of the present disclosure.

FIG. 8 is a schematic view of a display device provided by the present disclosure, and the display panel 100 of the display device is any one of the above-mentioned display panels. As illustrated in FIG. 8, the display device 110 further comprises a driving unit 19 connected with the each of the upper electrode, the first side electrode and the second side electrode of the microcapsule switch array of the display panel 100 in signals, for example, the driving unit is electrically connected with the electrodes to transmit driving signals and control the display state of each pixel unit of the display panel 100. The driving unit 19 for example is arranged on a side opposite to the display side of the display panel 100 or is arranged in other way, which is not limited in the embodiments of the disclosure.

Compared with a general reflective display device, the light outputting rate of the display device provided by the embodiments of the present disclosure is higher and the colored light emitted out has a higher color purity and thus has a broader color gamut, which is beneficial to obtaining higher display quality. At the same time, compared with a general LCD display device, the display device provided by the embodiments of the disclosure is lighter and thinner. Embodiments of the present disclosure do not have any limit to other structures of the display device.

The embodiments of the present disclosure further provide a display method applicable to the above-mentioned display device. The display method comprises: applying a signal to each of the microcapsule switch units of the microcapsule switch array to control each of the microcapsule switch units to be in an open state or a close state so as to control a grayscale of the pixel units respectively corresponding to the microcapsule switch units.

For example, combining FIG. 3-FIG. 8, for example, the black particles are negatively charged, an electric signal is applied to the first side electrode 6 and the second side electrode 7 so that the first side electrode 6 serves as a positive pole and the second side electrode 7 serves as a negative pole, and no electric signal is applied to the upper electrode 20. Driven by the electric field, the black charged particles 9 gather near the first side electrode 6. At this time, the microcapsule switch unit 15 is in the open state, and the environmental light passes through the microcapsule switch unit 15 and then enters the optical resonant structure 16; the light interference occurs, and the light of the particular frequency which satisfies the above-mentioned condition is transmitted out of the optical resonant structure 16 and then passes through the microcapsule switch unit corresponding to the sub-pixel unit, so that the sub-pixel unit displays the color corresponding to the light of the particular frequency. In addition, the light passes through the light conversion layer 8, the light conversion layer 8 converts a portion of the colored light except the light of the particular frequency displayed by the sub-pixel unit into the light of the particular frequency, and thus the light outputting rate and the light purity can be improved, which is beneficial to improving the light utilization and broadening the color gamut of the display.

For example, the display device 110 is required to be in a black state, an electric signal is applied to the upper electrode 20 so that the upper electrode 20 serves as a positive electrode, no electric signal is applied to the first side electrode 6 and the second side electrode 7, and the black charged particles 9 gather near the upper electrode 20, which prevents the environmental light from passing through microcapsule 5. At this time, the microcapsule switch unit 15 is in the close state, and the environmental light is blocked by the black charged particles and cannot pass through the microcapsule switch unit 15 and thus cannot enter the optical resonant structure 16, and the pixel unit is in a black state.

For example, the driving unit 19 further controls the value of the voltage applied to the upper electrode of each microcapsule switch unit of the microcapsule switch array to control the grayscale of the pixel units respectively corresponding to the microcapsule switch units.

What have been described above are only specific implementations of the present disclosure, the protection scope of the present disclosure is not limited thereto. The protection scope of the present disclosure should be based on the protection scope of the claims.

The application claims priority to the Chinese patent application 201710828272.4, filed on Sep. 14, 2017, the entire disclosure of which is incorporated herein by reference as part of the present application.

What is claimed is:

1. A display panel, comprising:
   a base substrate;
   a pixel array arranged on the base substrate and comprising a plurality of pixel units, wherein each of the plurality of pixel units comprises a plurality of sub-pixel units; and
   a light conversion layer arranged on a display side of the pixel array and provided in each of the plurality of sub-pixel units, wherein each of the plurality of sub-pixel units comprises an optical resonant structure, and the optical resonant structure comprises:
      a first reflection layer arranged on the base substrate;
      a second reflection layer arranged on the first reflection layer and parallel to the first reflection layer; and
      a dielectric layer arranged between the first reflection layer and the second reflection layer;
   in each of the plurality of sub-pixel units, the light conversion layer is configured to convert a part of environmental light into light iwth a special wavelength under excitation of the environmental light and allow the light with the special wavelength and the environmental light to enter the optical resonant structure, the light with the special wavelength comprises light of only one primary color, and the optical resonant structure is configured to allow the light with the special wavelength from the light conversion layer to be enhanced by interference and then exit from the optical resonant structure; thicknesses of the dielectric layers respectively in the plurality of sub-pixel units of each pixel unit are different from each other so that the light with the special wavelength of different colors exits from the optical resonant structure respectively in the plurality of sub-pixel units of the each pixel unit;
   no color filter is on a side of the light conversion layer away from the base substrate, and the environmental light does not pass through a color filter before entering the light conversion layer and the optical resonant structure.

2. The display panel according to claim 1, wherein; each of the plurality of pixel units comprises a first color sub-pixel unit displaying a first color, a second color sub-pixel unit displaying a second color and a third color sub-pixel unit display a third color, and the first color, the second color and the third color are different from each other.

3. The display panel according to claim 2, wherein; the light conversion layer comprises a first color light conversion layer, a second color light conversion layer and a third color light conversion layer, the first color light conversion layer is provided in a region where the first color sub-pixel unit is provided, the second color light conversion layer is provided in a region where the second color sub-pixel unit is provided, and the third color light conversion layer is provided in a region where the third color sub-pixel unit is provided.

4. The display panel according to claim 1, wherein the light conversion layer is a quantum dot layer.

5. The display panel according to claim 4, wherein a material of the light conversion layer is a semiconductor material.

6. The display panel according to claim 2, wherein the light conversion layer is provided on a side of the optical resonant structure away from the base substrate.

7. The display panel according to claim 6, wherein a thickness of the dielectric layer in the first color sub-pixel unit, a thickness of the dielectric layer in the second color sub-pixel unit and a thickness of the dielectric layer in the third color sub-pixel unit are different from each other.

8. The display panel according to claim 2, wherein the light conversion layer is between the first reflection layer and the second reflection layer of the optical resonant structure.

9. The display panel according to claim 8, wherein a sum of a thickness of the dielectric layer and a thickness of the light conversion layer in the first color sub-pixel unit, a sum of a thickness of the dielectric layer and a thickness of the light conversion layer in the second color sub-pixel unit, and a sum of a thickness of the dielectric layer and a thickness of the light conversion layer in the third color sub-pixel unit are different from each other.

10. The display panel according to claim 1, wherein the first reflection layer is a total reflection layer, and the second reflection layer is a transflective layer.

11. The display panel according to claim 1, further comprising a microcapsule switch array arranged on the display side of the pixel array, wherein, the microcapsule switch array comprises a plurality of microcapsule switch units which are stacked on the plurality of pixel units in a one-to-one manner.

12. The display panel according to claim 11, wherein each of the plurality of microcapsule switch units comprises: a microcapsule comprising a capsule wall, the capsule wall comprising an upper surface, a lower surface, a first side surface and a second side surface, and the upper surface and the lower surface being transparent; an upper electrode arranged on the upper surface of the microcapsule; and a first side electrode and a second side electrode respectively arranged on the first side surface and the second side surface of the microcapsule.

13. The display panel according to claim 12, wherein the microcapsule further comprises: a liquid medium; and a plurality of black charged particles arranged in the liquid medium inside the microcapsule.

14. The display panel according to claim 1, further comprising: an anti-reflection layer arranged on the display side of the pixel array and above the optical resonant structure and the light conversion layer.

15. The display panel according to claim 1, further comprising a protection layer covering the light conversion layer and the optical resonant structure.

16. A display device, comprising the display panel according to claim 1.

17. A display method applicable to the display device according to claim 16, wherein the display device further comprises a microcapsule switch array arranged on the display side of the pixel array, and the microcapsule switch array comprises a plurality of microcapsule switch units which are stacked on the plurality of pixel units in a one-to-one manner; and the display method comprises:
  allowing the light conversion layer to convert a part of environmental light into light with a special wavelength under excitation of the environmental light and allowing the light with the special wavelength and the environmental light to enter the optical resonant structure in each of the plurality of sub-pixel units;
  allowing the optical resonant structure to enhance the light with the special wavelength from the light conversion layer to by interference and then emit the enhanced light with the special wavelength out of the optical resonant structure in each of the plurality of sub-pixel units; and
  applying a signal to each of the plurality of microcapsule switch units of the microcapsule switch array to control each of the plurality of microcapsule switch units to be in an open state or an close state so as to control a grayscale of the plurality of pixel units respectively corresponding to the plurality of microcapsule switch units.

* * * * *